United States Patent
Shafie

(10) Patent No.: US 6,905,059 B2
(45) Date of Patent: *Jun. 14, 2005

(54) SOLDER BALL ATTACHMENT SYSTEM

(75) Inventor: Shafarin Shafie, Kedah (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/768,498

(22) Filed: Jan. 30, 2004

(65) Prior Publication Data

US 2004/0182910 A1 Sep. 23, 2004

Related U.S. Application Data

(63) Continuation of application No. 09/860,163, filed on May 17, 2001, now Pat. No. 6,739,498.

(51) Int. Cl.[7] .............................. B23K 1/08; B23K 1/20; B23K 37/04; B23K 37/00
(52) U.S. Cl. ........................ 228/39; 228/47.1; 228/49.2; 228/245; 228/246
(58) Field of Search ................................. 228/223, 245, 228/246, 180.22, 39, 41, 49.2, 47.1; 118/213; 438/106–108, 612–614

(56) References Cited

U.S. PATENT DOCUMENTS

| | | |
|---|---|---|
| 4,720,402 A | 1/1988 | Wojcik ...................... 427/282 |
| 5,205,896 A | 4/1993 | Brown et al. ................ 156/297 |
| 5,279,045 A | 1/1994 | Odashima et al. ............. 34/10 |
| 5,431,332 A | 7/1995 | Kirby et al. ................. 228/246 |
| 5,467,913 A | 11/1995 | Namekawa et al. .......... 228/41 |
| 5,704,536 A | 1/1998 | Chen et al. ................... 228/41 |
| 5,741,410 A | 4/1998 | Tsurushima ................. 204/297 |
| 5,839,191 A | 11/1998 | Economy et al. ............. 29/843 |
| 5,918,792 A | 7/1999 | Stumpe et al. ............... 228/41 |
| 6,056,190 A * | 5/2000 | Foulke et al. ............... 228/246 |
| 6,112,975 A * | 9/2000 | Lapastora ................ 228/248.1 |
| 6,158,649 A | 12/2000 | Miura ........................ 228/246 |
| 6,162,661 A * | 12/2000 | Link .......................... 438/108 |
| 6,253,992 B1 | 7/2001 | Fjelstad ..................... 228/245 |
| 6,364,196 B1 | 4/2002 | Wood et al. .................. 228/41 |
| 6,413,850 B1 * | 7/2002 | Ooroku et al. .............. 438/613 |
| 6,460,755 B1 | 10/2002 | Inoue et al. ................ 228/246 |
| 6,641,030 B1 * | 11/2003 | Freeman et al. ............ 228/246 |
| 6,703,259 B2 * | 3/2004 | Bayot ......................... 438/106 |
| 6,739,498 B2 * | 5/2004 | Shafie ........................ 228/223 |

* cited by examiner

*Primary Examiner*—Lynne R. Edmondson
(74) *Attorney, Agent, or Firm*—Schwegman, Lundberg, Woessner & Kluth, P.A.

(57) ABSTRACT

A solder ball attachment system for manufacturing an integrated circuit or the like is disclosed. The solder ball attachment system includes a flux station to apply flux onto a substrate and a solder ball placement station to place solder balls onto the flux on the substrate. The solder ball attachment system further includes a conveyor assembly to move the substrate between the flux station and the solder ball placement station.

28 Claims, 4 Drawing Sheets

SOLDER BALL ATTACHMENT SYSTEM

This application is a continuation of U.S. patent application Ser. No. 09/860,163, filed May 17, 2001 now U.S. Pat. No. 6,739,498, which is incorporated herein by reference.

TECHNICAL FIELD

The inventive subject matter relates generally to packaging and manufacturing of integrated circuits and the like and, more particularly, to a solder ball attachment system.

BACKGROUND INFORMATION

Integrated circuits in an electronic device are typically electrically connected to multiple other integrated circuits or components of the electronic device. For example, a processor chip in a computer will be connected to one or more sources of power, to memory devices or modules, input/output interfaces and the like. This can require that hundreds of electrical connections be made to the processor chip or integrated circuit (IC) chip. The IC chip will typically be mounted to a printed circuit board (PCB), and the multiple different electrical connections will need to be made between the IC chip and the PCB. One technology for making these multiple electrical connections is ball grid array (BGA) technology. In BGA technology, sometimes hundreds of extremely small solder balls, on the order of a micron in diameter, must be precisely placed according to a predetermined pattern to make electrical contact between conductive pins or pads on the IC chip and conductive pads on the substrate of the PCB. A misplacement of a few microns or less can result in a defective product.

The predetermined pattern in which the solder balls are placed will vary from one particular IC chip design to another. When a new IC chip is under development, the process for attaching or placing the solder balls must be confirmed or certified as being accurate and reliable before being implemented in a high volume manufacturing operation. A manual ball attachment jig is typically used in the development stage but this arrangement and process is time consuming and costly to load and place the balls and can delay the certification or acceptance of a new product and the process for manufacturing the product.

Accordingly, for the reasons stated above, and for other reasons that will become apparent upon reading and understanding the present specification, there is a need for a semiautomatic solder ball attachment system that is efficient to shorten the lead time of development activities and reduce costs.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention. Such embodiments of the inventive subject matter may be referred to, individually and/or collectively, herein by the term "invention" merely for convenience and without intending to voluntarily limit the scope of this application to any single invention or inventive concept if more than one is in fact disclosed.

Figure 1:
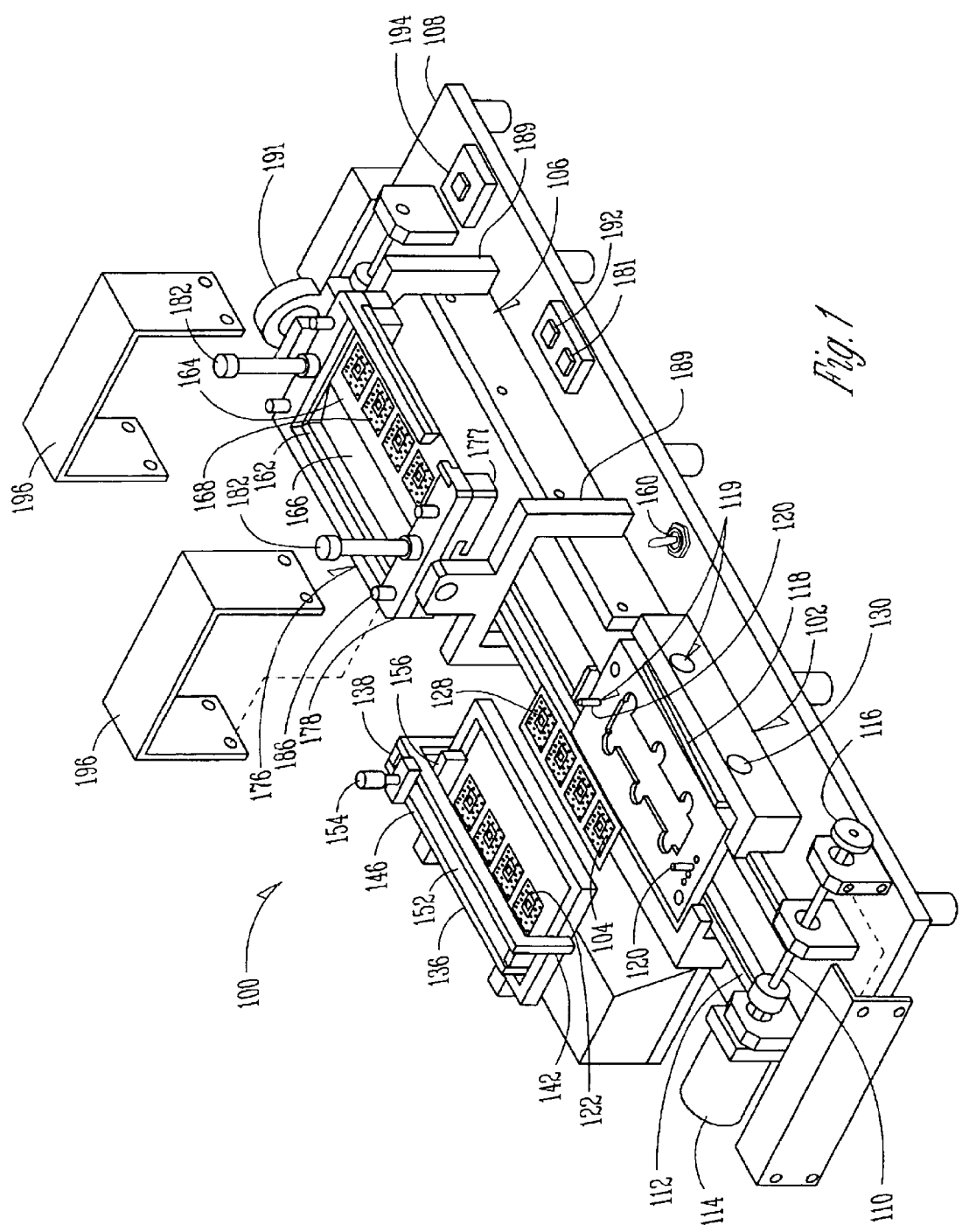
FIG. 1 is a perspective view of a solder ball attachment system in accordance with an embodiment of the present invention.

FIG. 1 shows a perspective view of a solder ball attachment system 100 in accordance with an embodiment of the present invention. The solder ball attachment system 100 includes a flux station 102 to apply flux to a substrate 104 and a solder ball placement station 106 to place solder balls onto the substrate 104. The flux station 102 and the solder ball placement station 106 are mounted on a platform 108 adjacent one another. A conveyor assembly 110 is also mounted on the platform 108 and moves the substrate 104 between the flux station 102 and the solder ball placement station 106. The conveyor assembly 110 includes a belt or pair of conveyor belts 112. The belts 112 are driven by a motor 114, and a hand crank 116 may be provided to operate the conveyor belts 112 manually. A substrate holder or support 118 rests on or is attachable to the conveyor belts 112 to hold the substrate 104 during processing.

The solder ball attachment system 100 further includes an alignment arrangement 119 for proper alignment of the substrate 104 during processing in the flux station 102 and the solder ball placement station 106. As part of the alignment arrangement 119, the substrate support 118 may include a plurality of guide pins 120 mounted thereon for proper alignment of the substrate 104 during processing in the flux station 102 and solder ball placement station 106.

Figure 2:
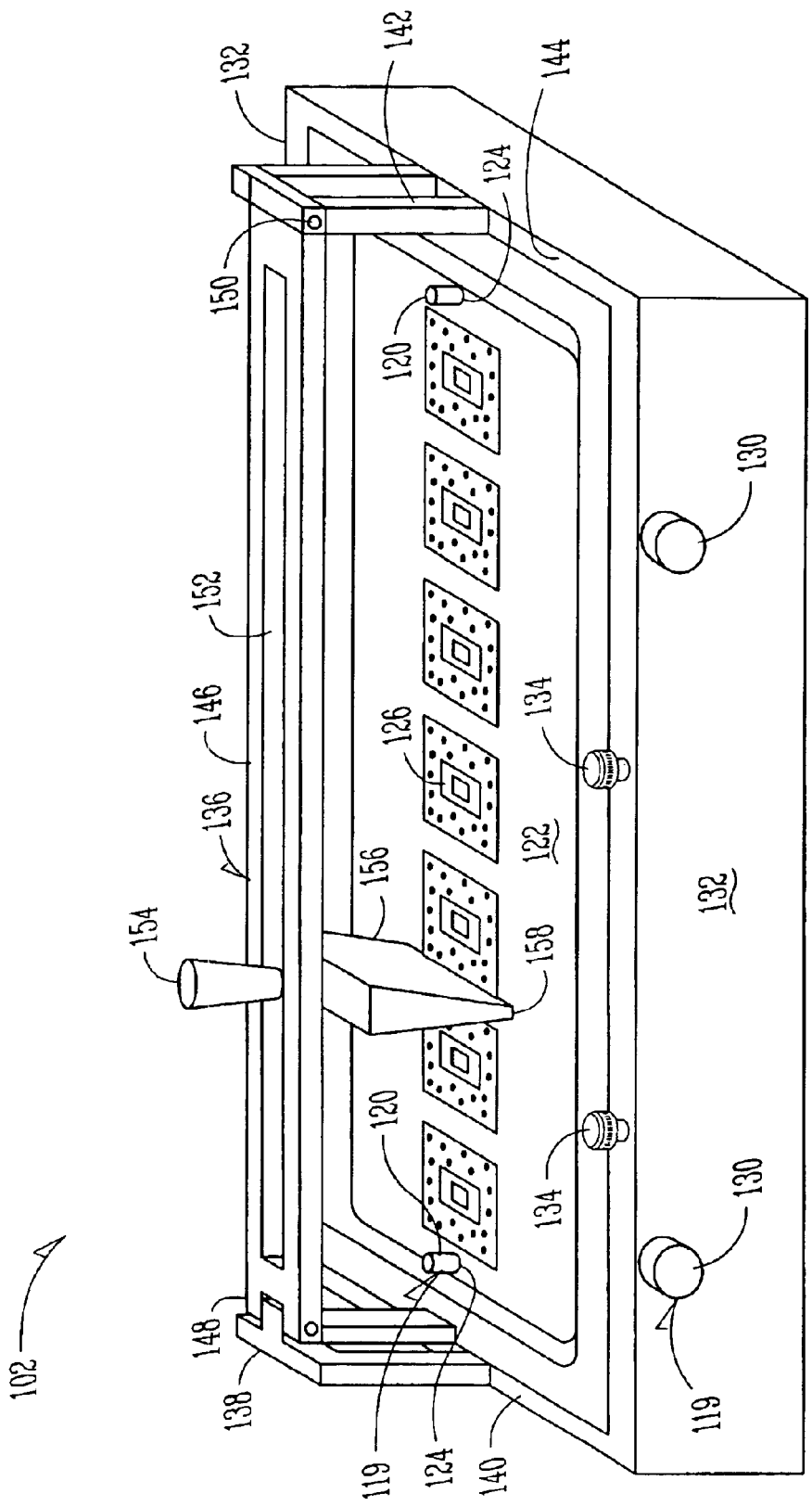
FIG. 2 is a detailed perspective view of a flux station for the ball attachment system of FIG. 1.

To begin a solder ball placement process, the substrate 104 is placed onto the substrate support 118 on the conveyor belt or belts 112 and the substrate 104 is moved into proper position at the flux station 102. Referring also to FIG. 2 which is a detailed perspective view of the flux station 102, the flux station 102 includes a flux screen 122. The flux screen 122 is lowered over the substrate 104. The flux screen 122 has at least two guide holes 124 formed therein through which the guide pins 120 of the substrate support 118 are inserted for alignment of the flux screen 122 with the substrate 104. The flux screen 122 has a plurality of openings 126 formed therein in a predetermined pattern through which flux is applied or printed onto the substrate 104 according to the predetermined pattern. The predetermined pattern of the openings 126 may vary according to the design of the particular IC chip and the required placement of the solder balls on the substrate 104 to make electrical connections between the particular IC chip and conductive pads 128 (FIG. 1) formed on the substrate 104.

The alignment arrangement 119 may also include a plurality of adjustment screws 130 selectively positioned around a perimeter or sides 132 of the flux station 102 to precisely adjust the placement of the openings 126 in the flux screen 122 relative to the conductive pads 128 formed on the substrate 104 for proper alignment between the opens 126 and the conductive pads 128. After alignment, the flux screen 122 may then be clamped in place by clamp screws 134 to prevent the flux screen 122 from moving relative to the substrate 104 during application of the flux.

The flux station 102 also includes a flux applicator assembly 136. The flux applicator assembly 136 includes a first upright support member 138 attached to one side 140 of the flux station 102 and a second upright member 142 attached to another side 144 of the flux station 102 opposite to the one side 140. A horizontal support member 146 is suspended between the first and second upright support members 138 and 140 at a predetermined distance above the flux screen 122. The horizontal support member 146 is preferably hinged to the first upright member 138 by a hinge arrangement 148 and the horizontal support member 146 may be attached to the second upright support member 142 by a removable pin 150 or the like. This horizontal support member 146 can then be swung open to remove or replace the flux screen 122. The horizontal support member 146 has a longitudinal slot 152 formed therein through which a handle 154 is attached to a squeeze blade 156. The squeeze blade 156 may be made from a resilient material such a flexible plastic or rubber type material with one end 158 in sliding contact with the upper or exposed surface of the flux screen 122. The handle 154 is slidable within the slot 152 to move the squeeze blade 156 back and forth across the flux screen 122 to push or force flux uniformly through the openings 126 and onto the substrate 104. The flux will then be applied or printed evenly or uniformly on the substrate 104 in the predetermined pattern.

After flux is applied to the substrate 104, the flux screen 122 is removed from the substrate 104 and the conveyor belts 112 may be activated to move the substrate 104 to the solder ball placement station 106. A conveyor belt operation switch 160 (FIG. 1) is mounted to the platform 108 and is electrically connected to the motor 114 to control the operation of the motor 114 to move the conveyor belts 112 in a forward direction or a reverse direction. In one position the conveyor switch 160 causes the motor 112 to move the substrate holder 118 from the flux station 102 to the ball placement station 106 and in another switch position, the conveyor operation switch 160 causes the substrate holder 118 to move in an opposite direction.

Figure 3:
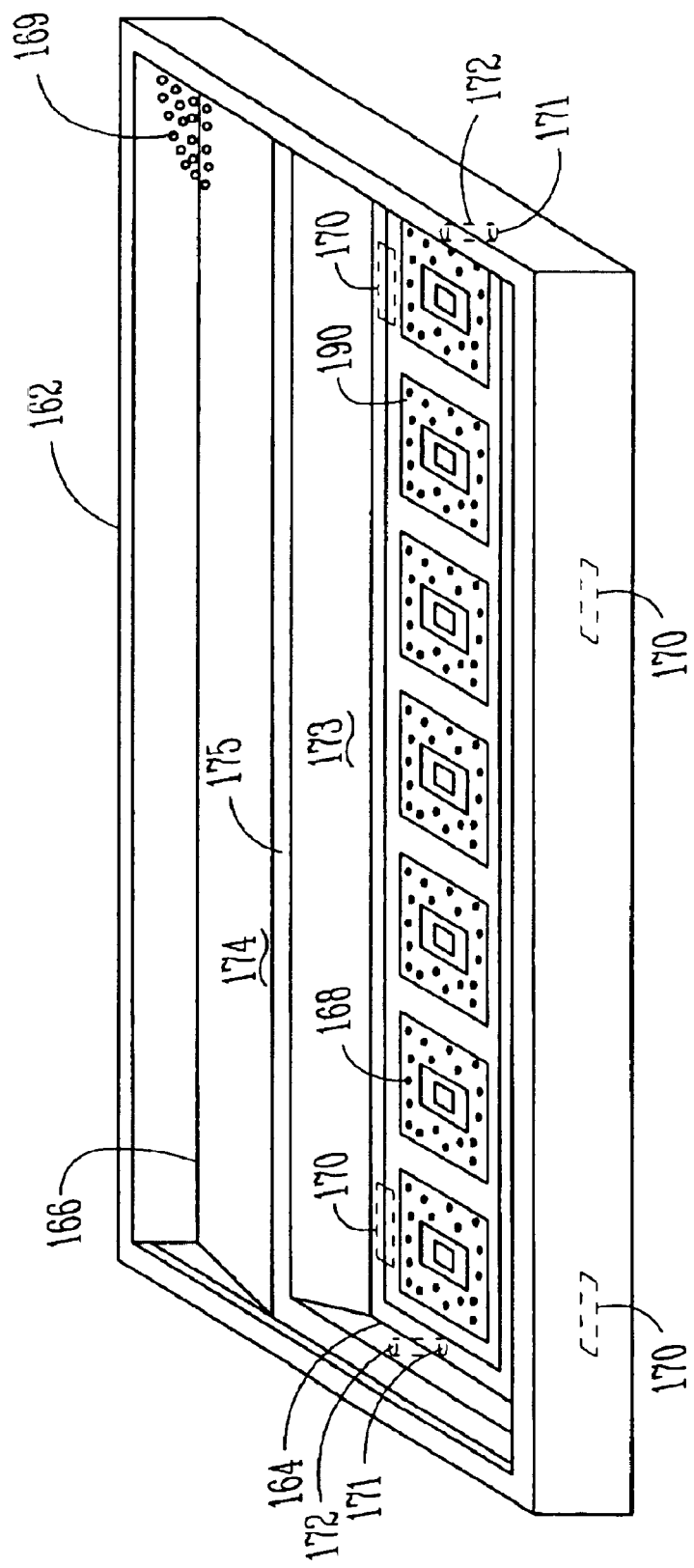
FIG. 3 is a detailed perspective view of a tray portion of a ball placement station for the ball attachment system of FIG. 1.

Referring also to FIG. 3 which is a detailed perspective view of a tray portion 162 of the solder ball placement station 106, the tray portion 162 includes a first section or ball placement section 164 and a second section or ball bin 166. A ball placement mask 168 is mounted in the first section 164 and the second section or ball bin 166 is where the solder balls 169 are stored. The ball placement mask 168 is mounted to an underside of the first section 164 by an attachment mechanism 170. The attachment mechanism 170 may be a latch-arrangement or magnetic holders. The ball placement mask 168 is properly aligned to the first section 164 by guide holes 171 formed in the ball placement mask 168 which are received on guide pins 172 formed on the underside of the first section 164.

Each section 164 and 166 has a respective ramp 173 and 174 that slopes away from a center segment 175 of the tray portion 162. Accordingly, the solder balls 169 will be retained in the ball bin 166 when the tray portion 162 is level in a non-ball placement or non-operational position.

Figure 4:
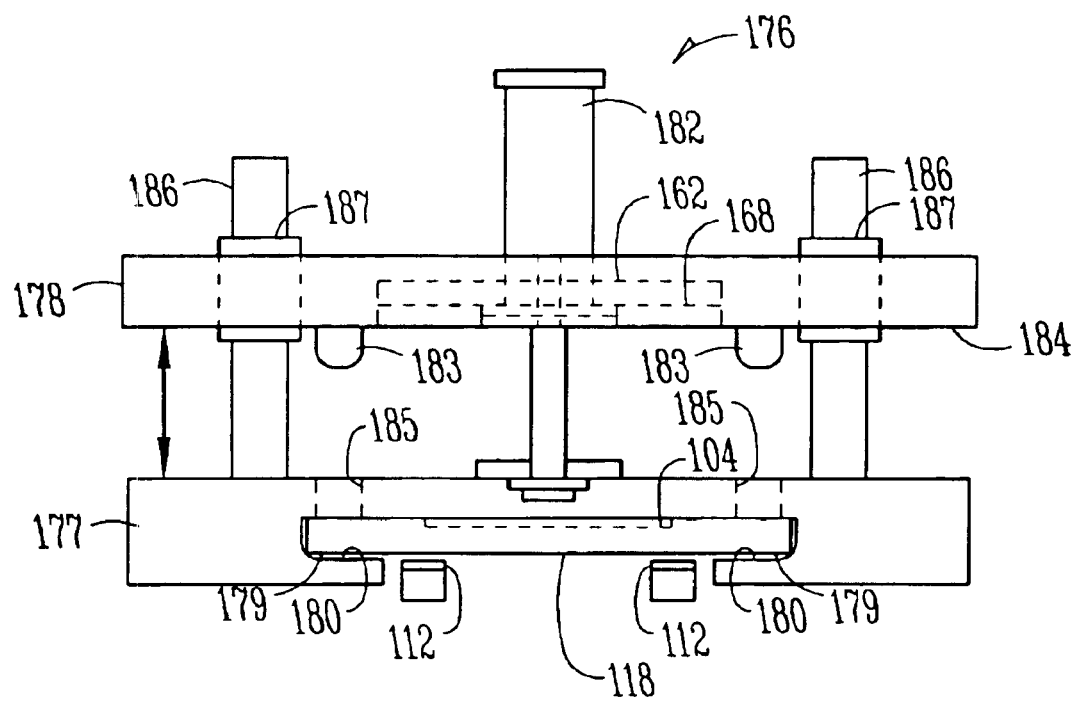
FIG. 4 is a detailed side elevation view of a pivotable carriage assembly of a ball placement station in accordance with an embodiment of the present invention.

Referring also to FIG. 4 which is a detailed view of a portion of a pivotable carriage assembly 176 of the solder ball placement station 106. The pivotable carriage assembly 176 includes a lower portion or substrate support holder 177 and an upper portion or tray portion holder 178. As the conveyor belts 112 move the substrate support 118 into the solder ball placement station 106, side edges 179 of the substrate support 118 will be received into recesses 180 formed in the substrate support holder 177 of the pivotable carriage assembly 176. When the substrate support 118 is in proper position at the solder ball placement station 106, an "UP" illuminated pushbutton 181 (FIG. 1) will turn on. The "UP" pushbutton 181 may then be pushed to operate a pair of actuators 182 to raise the substrate support holder 177 and substrate 104 to position the substrate 104 under the ball placement mask 168. The actuators 182 are each respectively mounted proximate to opposite ends of the tray portion holder 178 of the pivotable carriage assembly 176, as best shown in FIG. 1. Each of the actuators 182 may be an air cylinder or similar device to raise the substrate support holder 177 into position and to lower the substrate support holder 177 and substrate 104 after a ball placement operation.

The tray portion 162 is mounted to the tray portion holder 178. The tray portion holder 178 has a plurality of guide posts 183 formed on an underside 184 thereof. As the substrate support holder 177 is raised, the guide posts 183 will be received into respective guide holes 185 formed in the substrate support holder 177 to properly align the substrate support 118 and substrate 104 with the ball placement mask 168. Additionally, a pair of stability shafts 186 are mounted to the substrate support holder 177 at each end thereof proximate to each actuator 182, as best shown in FIG. 1. The stability shafts 186 each extend through openings 187 formed in the tray portion holder 178 and guide movement of the substrate support holder 177 into proper position with the tray portion holder 178 and the substrate 104 into proper alignment with the ball placement mask 168 for a ball placement operation.

Referring also back to FIG. 1, the tray portion 162 of the solder ball placement station 106 is mounted in the tray portion holder 178 of the pivotable carriage assembly 176. The pivotable carriage assembly 176 is pivotably mounted at two opposite ends thereof to a pair of respective stanchion members 189. The stanchion members 189 are mounted on the platform 108 and support the pivotable carriage assembly 176 over the conveyor assembly 110 at the solder ball placement station 106. The pivotable carriage assembly 176 is retained in a level position while the substrate support 118 is raised to a location under the tray portion 162. After alignment of the substrate support 118 with the tray portion 162, the pivotable carriage assembly 176 is released and may be pivoted to a position to cause the solder balls 169 (FIG. 3) to roll from the ball bin section 166 into the first section 164 of the tray portion 162 containing the ball placement mask 168 (FIG. 3). The ball placement mask 168 has a plurality of holes 190 formed therein in a selected pattern to place the solder balls 169 on the substrate 104 according to the selected pattern. The selected pattern of holes. 190 may be substantially the same as or coordinate with the predetermined pattern of openings 126 (FIG. 2) formed in the flux screen 122 for applying the flux. When the solder balls 169 roll over the ball placement mask 168, the solder balls 169 will drop by gravity into any unfilled holes 190 in the mask 168 and are placed or attached to the substrate 104 according to the selected pattern of holes 190. The pivotable carriage assembly 176 may be tilted back and forth until all of the holes 190 have been filled with a solder ball 169. The carriage assembly 176 is then tilted or pivoted to a position to cause all remaining or unused solder balls 169 to roll back into the ball bin 166 where the balls 169 are retained until the next substrate 104 is received for processing. The carriage assembly 176 may be tilted or pivoted by a wheel 191 attached to an axle (not shown) of the carriage assembly 176 through a hub of the stanchion 189.

After placement of the solder balls 169 on the substrate 104, the carriage assembly 176 is returned and retained in a level or horizontal position. A "DOWN" illuminated pushbutton 192 is turned on. The "DOWN" pushbutton 192 is pushed to operate the actuators 182 to lower the substrate support 118 back onto the conveyor belts 112. The conveyor belt operation switch 160 may then be operated in the reverse direction to move the substrate support 118 from the solder ball placement station 106. The completed substrate 104 may be removed from the substrate support 118 and another unfinished substrate may be placed on the support 118 for solder ball placement.

The solder ball attachment system 100 also preferably includes a power ON/OFF switch 194 mounted on the platform 108 to control the overall application of power to the solder ball attachment system 100. The solder ball attachment system 100 may also include actuator covers 196 to cover the actuators 182 and protect them from damage.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of embodiments of the present invention. Therefore, it is intended that embodiments of this invention be limited only by the claims and the equivalents thereof.

What is claimed is:

1. A solder ball attachment system, comprising:
   a flux station to apply flux to a substrate, wherein the flux station comprises a flux screen including a plurality of openings;
   a solder ball placement station including:
      a solder ball placement mask having a plurality of placement holes; and
      a pivotable carriage assembly to receive the substrate, to align the substrate with the solder ball placement mask, and to pivot the solder ball placement mask and the substrate to allow solder balls to roll on the solder ball placement mask and to drop into each of the plurality of placement holes when the pivotable carriage assembly is pivoted; and
      a conveyor assembly to move the substrate between the flux station and the solder ball placement station.

2. The solder ball attachment system of claim 1, wherein the plurality of openings of the flux screen is positioned above the substrate.

3. The solder ball attachment system of claim 1, wherein the flux station includes an applicator assembly to apply flux to the substrate.

4. The solder ball attachment system of claim 1, wherein the plurality of placement holes of the solder ball placement mask forms a pattern to place the solder balls on the substrate according to the pattern.

5. The solder ball attachment system of claim 1, wherein the pivotable carriage assembly further includes at least one actuator to position the substrate relative to the solder ball placement mask.

6. The solder ball attachment system of claim 5, wherein the actuator includes an air cylinder.

7. A solder ball attachment system, comprising:
   a flux station to apply flux to a substrate, wherein the flux station comprises a flux screen including a plurality of opening;
   a solder ball placement station including:
      a solder ball placement mask having a plurality of placement holes; and
      a pivotable carriage assembly to receive the substrate, to align the substrate with the solder ball placement mask, and to pivot the solder ball placement mask and the substrate to allow solder balls to roll on the solder ball placement mask and to drop into each of the plurality of placement holes when the pivotable carriage assembly is pivoted; and
   a conveyor assembly to move the substrate between the flux station and the solder ball placement station; and
   an indicator to identify the position of the substrate relative to a position in the solder ball placement station.

8. The solder ball attachment system of claim 7, wherein the indicator includes an illuminated indicator.

9. The solder ball attachment system of claim 1, wherein the conveyor assembly includes at least one conveyor belt.

10. The solder ball attachment system of claim 9, wherein the conveyor belt extends in a straight direction between the flux station and the solder ball placement station.

11. A solder ball attachment system, comprising:
   a flux station including a flux screen having a plurality of openings to apply flux through the openings to a substrate;
   a solder ball placement station including:
      a tray portion having a solder ball placement mask, the placement mask having a plurality of placement holes; and
      a pivotable carriage assembly having a tray portion holder to hold the tray portion, a substrate support holder to receive the substrate, and a guide structure to guide an alignment of the tray portion holder with the substrate support holder to allow solder balls to drop into the placement holes to the substrate when the tray portion holder and the substrate support portion is pivoted; and
      a conveyor assembly to move the substrate between the flux station and the solder ball placement station.

12. The solder ball attachment system of claim 11, wherein the flux station comprises an applicator assembly to allow the flux going through the plurality of openings of the flux screen.

13. A solder ball attachment system, comprising:
   a flux station including a flux screen having a plurality of openings to apply flux through the openings to a substrate;
   a solder ball placement station including:
      a tray portion having a solder ball placement mask, the placement mask having a plurality of placement holes; and
      a pivotable carriage assembly having a tray portion holder to hold the tray portion, a substrate support holder to receive the substrate, and a guide structure to guide an alignment of the tray portion holder with the substrate support holder to allow solder balls to drop into the placement holes to the substrate when the tray portion holder and the substrate support portion is pivoted; and
   a conveyor assembly to move the substrate between the flux station and the solder ball placement station, wherein the flux station comprises an applicator assembly to allow the flux going through the plurality of openings of the flux screen, and wherein the applicator assembly includes a squeeze blade.

14. A solder ball attachment system, comprising:
   a flux station including a flux screen having a plurality of openings to apply flux through the openings to a substrate;

a solder ball placement station including:
- a tray portion having a solder ball placement mask, the placement mask having a plurality of placement holes; and
- a pivotable carriage assembly having a tray portion holder to hold the tray portion, a substrate support holder to receive the substrate, and a guide structure to guide an alignment of the tray portion holder with the substrate support holder to allow solder balls to drop into the placement holes to the substrate when the tray portion holder and the substrate support portion is pivoted; and a conveyor assembly to move the substrate between the flux station and the solder ball placement station, wherein the flux station further includes an alignment arrangement to align the flux screen with the substrate.

15. The solder ball attachment system of claim 14, wherein the alignment arrangement includes a plurality of adjustment screws positioned around a perimeter of the flux station to adjust the position of the flux screen relative to the substrate.

16. The solder ball attachment system of claim 11, wherein the tray portion of the solder ball placement station further includes a solder ball bin to stare the solder balls when the pivotable carriage assembly is in a first position, and to release the solder balls to roll on the solder ball placement mask when the pivotable carriage assembly is in a second position.

17. The solder ball attachment system of claim 11, wherein the pivotable carriage assembly further includes at least one actuator to raise the substrate support holder to the tray portion holder.

18. The solder ball attachment system of claim 17, wherein the actuator includes an air cylinder.

19. A solder ball attachment system, comprising:

a flux station including a flux screen having a plurality of openings to apply flux through the openings to a substrate;

a solder ball placement station including:
- a tray portion having a solder ball placement mask, the placement mask having a plurality of placement holes; and
- a pivotable carriage assembly having a tray portion holder to hold the tray portion, a substrate support holder to receive the substrate, and a guide structure to guide an alignment of the tray portion holder with the substrate support holder to allow solder balls to drop into the placement holes to the substrate when the tray portion holder and the substrate support portion is pivoted; and a conveyor assembly to move the substrate between the flux station and the solder ball placement station, wherein the guide structure of the pivotable carriage assembly includes at least one stability shaft extending between the substrate support holder and the tray portion holder.

20. A method comprising:

applying flux to a substrate at a flux station;

moving the substrate from the flux station to a solder ball placement station;

aligning the substrate with a solder ball placement mask, the solder ball placement mask having a plurality of placement holes; and pivoting the substrate and the solder ball placement mask to allow a portion of a plurality of solder balls to go through the plurality of placement holes onto the substrate.

21. The method of claim 20, wherein applying the flux to the substrate includes:

aligning a flux screen over the substrate; and forcing the flux through a plurality of openings formed in the flux screen.

22. The method of claim 20, wherein moving the substrate includes conveying the substrate using a conveyor extending between the flux station and the solder ball placement station.

23. The method of claim 22, wherein conveying the substrate includes conveying the substrate on a conveyor belt.

24. The method of claim 20, wherein aligning the substrate with the solder ball placement mask includes raising the substrate to the solder ball placement mask.

25. A method comprising:

applying flux to a substrate at a flux station;

moving the substrate from the flux station to a solder ball placement station;

aligning the substrate with a solder ball placement mask, the solder ball placement mask having a plurality of placement holes; and pivoting the substrate and the solder ball placement mask to allow a portion of a plurality of solder balls to go through the plurality of placement holes onto the substrate, wherein aligning the substrate with the solder ball placement mask includes raising the substrate to the solder ball placement mask, and wherein raising the substrate to the solder ball placement mask includes guiding the substrate along at least one shaft extended between the substrate and the solder ball placement mask.

26. The method of claim 24, wherein aligning the substrate with solder ball placement mask includes raising the substrate to and solder ball placement mask using an actuator.

27. The method of claim 26, wherein the actuator includes an air cylinder.

28. A method of claim 20, wherein pivoting the substrate and the solder ball placement mask includes:

pivoting the substrate and the solder ball placement mask in a first direction to cause the portion of the plurality of the solder balls to roll from a solder ball bin to the solder ball placement mask and to drop through the plurality of placement holes; and pivoting the substrate and the solder ball placement mask in a second direction to cause a second portion of the plurality of the solder balls to roll back to the solder ball bin.

* * * * *

UNITED STATES PATENT AND TRADEMARK OFFICE
CERTIFICATE OF CORRECTION

PATENT NO.    : 6,905,059 B2
DATED         : June 14, 2005
INVENTOR(S)   : Shafarin Shafie It is certified that error appears in the above-identified patent and that said Letters Patent is hereby corrected as shown below:

Column 5,
Line 61, delete "opening;" and insert -- openings; --, therefor.

Column 7,
Line 24, delete "stare" and insert -- store --, therefor.

Signed and Sealed this

Eighth Day of November, 2005

JON W. DUDAS
*Director of the United States Patent and Trademark Office*